United States Patent [19]

Huang

[11] 4,258,272
[45] Mar. 24, 1981

[54] TTL TO CMOS INPUT BUFFER CIRCUIT
[75] Inventor: Jen-Yen Huang, San Jose, Calif.
[73] Assignee: National Semiconductor Corporation, Santa Clara, Calif.
[21] Appl. No.: 21,495
[22] Filed: Mar. 19, 1979
[51] Int. Cl.³ ............................................ H03K 19/08
[52] U.S. Cl. .............................. 307/475; 307/DIG. 1
[58] Field of Search .................. 307/DIG. 1, 208, 205

[56] References Cited
U.S. PATENT DOCUMENTS

| 3,676,700 | 7/1972 | Buchanan | 307/205 |
| 4,031,409 | 6/1977 | Shimada et al. | 307/205 |

OTHER PUBLICATIONS

"TTL-To-CMOS Buffer Circuit" by Andrew Dingwall, RCA Technical Notes, No. 1114, Jun. 11, 1975, 3 sheets.

Primary Examiner—Harold A. Dixon
Attorney, Agent, or Firm—Brown & Martin

[57] ABSTRACT

A TTL to CMOS input buffer integrated circuit having an input terminal for connection to an output terminal of a TTL device is disclosed. The buffer circuit includes a first CMOS inverter connected to the input terminal, including a first p-channel FET connected to a supply terminal and a first n-channel FET connected to a ground terminal, wherein the drain of the first p-channel FET is connected to the drain of the first n-channel FET at a first node; a second n-channel FET having its gate connected to the input terminal and its source connected to the ground terminal; a third n-channel FET having its gate connected to the first node, its drain connected to the supply terminal, and its source connected to the drain of the second n-channel FET at a second node for forcing the potential at the second node to be less than the potential at the first node by the amount of the threshold voltage of the third n-channel FET; and a second p-channel FET having its gate connected to the second node, its source connected to the first node, its drain connected to the ground terminal, and its substrate connected to the supply terminal, for reducing the rate at which the third n-channel FET becomes conductive when gated on in a said integrated circuit in which the threshold of the n-channel FET's is greater than the threshold of the p-channel FET's.

12 Claims, 6 Drawing Figures

TTL TO CMOS INPUT BUFFER CIRCUIT

BACKGROUND OF THE INVENTION

The present invention generally pertains to semiconductor circuits, and is particularly directed to an improved TTL to CMOS input buffer circuit.

A typical input buffer for a CMOS circuit essentially includes a CMOS inverter, as shown in FIG. 1. The CMOS inverter includes a p-channel field effect transistor (FET) P connected to a supply terminal Vcc and a n-channel FET connected to a ground terminal. The gate of each FET, is connected to an input terminal $V_{IN}$ which in turn may be connected to an output terminal of a TTL device. The drains of the two FET's are connected together at an output terminal $V_{OUT}$.

The ideal output transfer characteristic for the typical input buffer circuit of FIG. 1 is shown in FIG. 2, wherein the trip point for the buffer circuit is shown as occurring at one-half the supply voltage, $\frac{1}{2}$ Vcc. However, this transfer characteristic is but an ideal; and in reality, the trip point is affected by variations in the process by which the CMOS inverter is fabricated.

FIG. 3 illustrates the span of trip point variation in the output transfer characteristic that is due to variations in the fabrication process. These process variations affect the gain of the p-channel FET and the n-channel FET so that the gain for each type of device is within a range between a specified maximum gain and a specified minimum gain related to the tolerances specified for the fabrication process. A CMOS FET having a high gain has a relatively low threshold voltage for being gated on and rendered conductive, whereas, a CMOS FET having a low gain has a relatively high threshold voltage for being gated on and rendered conductive. When the CMOS inverter of FIG. 1 includes a p-channel FET having the specified maximum gain and a n-channel FET having the specified minimum gain, the trip point is at $V_{T\,MAX}$, as shown in FIG. 3. When the inverter of FIG. 1 includes a p-channel FET having the minimum specified gain and a n-channel FET having a maximum specified gain, the trip point is at $V_{T\,MIN}$. The span of trip point variation, $\Delta V_T = V_{T\,MAX} - V_{T\,MIN}$.

The span of trip point variation also is affected by such factors as the supply voltage Vcc and temperature. However, such variations are minor in comparison to variations due to the fabrication process.

For a fixed supply voltage and temperature the span of trip point variation $\Delta V_T$ typically is within a range of from 1.5 volts to 1.8 volts. However, in order for the CMOS inverter to function as an input buffer circuit to a CMOS device from a TTL device, the span of trip point variation cannot exceed 1.2 volts and still be compatible with the TTL device.

In accordance with the prior art, in order to achieve compatibility with the TTL device, either external components must be inserted between the output of the TTL device and the CMOS input buffer circuit, or the CMOS input buffer circuit must be fabricated according to tighter process tolerances so as to reduce the specified range between the maximum and minimum gains for the n-channel FET's and p-channel FET's. Both alternatives are unattractive from the standpoint of cost.

SUMMARY OF THE INVENTION

The present invention provides a TTL to CMOS input buffer integrated circuit fabricated in accordance with typical process tolerances in which the span of trip point variation is such that the buffer circuit may be connected directly to the output of the TTL device. The present invention achieves this result by providing an internal compensation circuit integrated within the TTL to CMOS input buffer circuit that reduces the span of the trip point for the total buffer circuit.

In fabricating the TTL to CMOS input buffer integrated circuit all of the FET's are subject to the same process variations. As a result all of the p-channel FET's have the same given threshold and all of the n-channel FET's have the same given threshold, which may be more than, less than, or the same as the threshold of the p-channel FET's.

To compensate for the effects of the threshold of the n-channel FET's being greater than the threshold of the p-channel FET's, a preferred embodiment of a TTL to CMOS input buffer integrated circuit that includes an input terminal for connection to an output terminal of a TTL device; a supply terminal; a ground terminal; and a first CMOS inverter connected to the input terminal, including a first p-channel FET connected to the supply terminal and a first n-channel FET connected to the ground terminal, wherein the drain of the first p-channel FET is connected to the drain of the first n-channel FET at a first node; further includes a second n-channel FET having its gate connected to the input terminal and its source connected to the ground terminal; a third n-channel FET having its gate connected to the first node, its drain connected to the supply terminal, and its source connected to the drain of the second n-channel FET at a second node for forcing the potential at the second node to be less than the potential at the first node by the amount of the threshold voltage of the third n-channel FET; and a second p-channel FET having its gate connected to the second node, its source connected to the first node, its drain connected to the ground terminal, and its substrate connected to the supply terminal for reducing the rate at which the third n-channel FET becomes conductive when gated on in a said integrated circuit in which the threshold of the n-channel FET's is greater than the threshold of the p-channel FET's. The effect of the compensation provided by this circuit is to cause the $V_{T\,MAX}$ trip point for the total buffer circuit to be lower, whereby the span of trip point variation is reduced.

To compensate for the effects of the threshold of the p-channel FET's being greater than the threshold of the n-channel FET's, a complementary compensation circuit is provided, as described in detail hereinbelow in the description of the preferred embodiments.

Additional fractures of the present invention also are discussed in relation to the description of the preferred embodiments.

DESCRIPTION OF THE PREFERRED EMBODIMENTS

Figure 4:
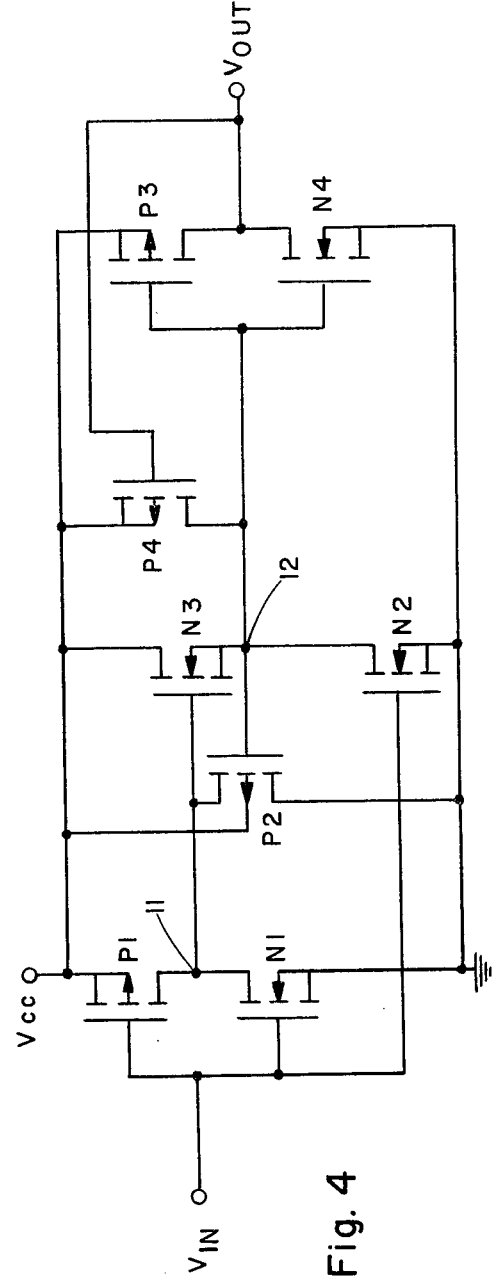
FIG. 4 is a schematic circuit diagram of one preferred embodiment of a TTL to CMOS input buffer integrated circuit according to the present invention.

FIG. 4 illustrates a TTL to CMOS input buffering integrated circuit for compensating for the effects of the threshold of the n-channel FET's being greater than the threshold of the p-channel FET's. The circuit includes an input terminal $V_{IN}$ for connection to an output terminal of a TTL device; a supply terminal Vcc; a ground terminal; first, second, third and fourth p-channel FET's P1, P2, P3 and P4; and first, second, third and fourth n-channel FET's N1, N2, N3 and N4.

The first p-channel FET P1 is connected to the first n-channel FET N1 to form a first CMOS inverter to which connected to the input terminal, $V_{IN}$. The source of the first p-channel P1 is connected to the supply terminal Vcc; and the source of the first n-channel FET N1 is connected to the ground terminal. The drain of the first p-channel FET P1 is connected to the drain of the first n-channel FET N1 at a first node 11.

The second n-channel FET N2 has its gate connected to the input terminal $V_{IN}$ and its source connected to the ground terminal.

The third n-channel FET N3 has its gate connected to the first node 11, its drain connected to the supply terminal Vcc, and its source connected to the drain of the second n-channel FET N2 at a second node 12 for forcing the potential at the second node 12 to be less than the potential at the first node 11 by the amount of the threshold voltage of the third n-channel FET N3.

The second p-channel FET P2 has its gate connected to the second node 12, its source connected to the first node 11, its drain connected to the ground terminal, and its substrate connected to the supply terminal Vcc for reducing the rate at which the third n-channel FET N3 becomes conductive when gated on in a said integrated circuit in which the threshold of the n-channel FET's is greater than the threshold of the p-channel FET's.

A second CMOS inverter formed by the FET's P3 and N4 is connected to the second node 12. The third p-channel FET P3 has its source connected to the supply terminal Vcc; and the fourth n-channel FET N4 has its source connected to the ground terminal and its drain connected to the drain of the third p-channel FET P3 at a third node 13 for providing a non-inverted output signal at output terminal $V_{OUT}$. The fourth p-channel FET P4 has its gate connected to the third node 13, its source connected to the supply terminal Vcc, and its drain connected to the second node 12 for causing the potential at the second node 12 to rise high enough to terminate conduction in the third p-channel FET P3 when the fourth n-channel FET N4 has been rendered conductive, and for terminating any conduction through the third n-channel FET N3.

The FET's P1 and N1 form a normal CMOS inverter, the output of which at node 11 controls the gate of the FET N3.

The FET N3 takes the place of a p-channel FET which typically might be connected to an n-channel FET such as FET N2 at a common node, such as node 12. One advantage of connecting the drain of N2 and the source of N3 to the node 12 is that both have the same threshold characteristics (in view of having been fabricated in the same processing steps), and as a result they track each other and do not adversely affect the span of trip point variation due to any differences in their respective threshold, as could be the effect if a p-channel FET were substituted for the n-channel FET N3.

Figure 3:
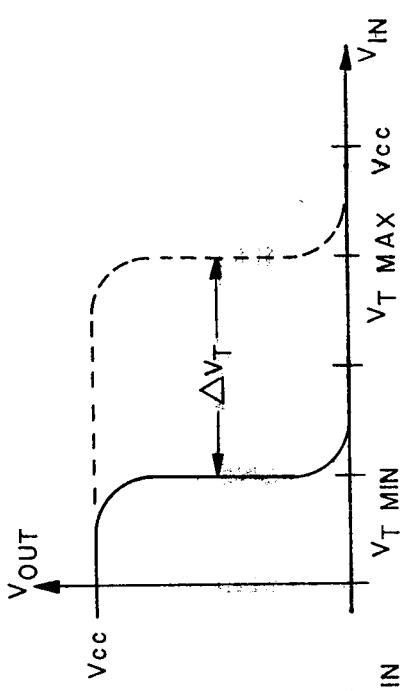
FIG. 3 illustrates the span of trip point variation in the output transfer characteristic of CMOS inverters that is due to variations in the fabrication process.
Figure 2:
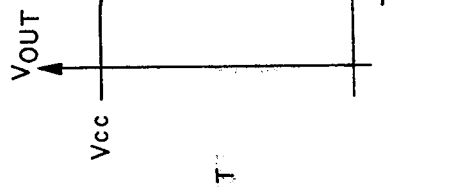
FIG. 2 shows an ideal output transfer characteristic for a CMOS inverter.
Figure 1:
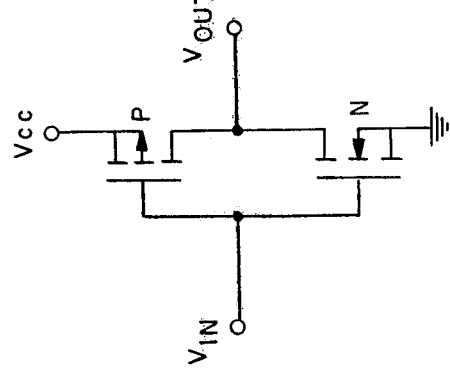
FIG. 1 is a schematic circuit diagram of a prior art CMOS inverter.

Another advantage of using the n-channel FET N3 is that the FET N3 and the p-channel FET P2 combine to form a compensating loop in the following manner:

Assume a maximum p-channel gain and a minimum n-channel gain, which corresponds to $V_{TMAX}$ in FIG. 3. Then when the signal at the input terminal $V_{IN}$ changes from high to low, the signal level at the node 11 trips very soon. The voltage at node 11 has to reach the threshold voltage of the FET N3 before it starts pulling node 12 high. Being a minimum gain n-channel FET, the FET N3's threshold is at its maximum value. Thus the voltage between node 11 and node 12 must rise to the maximum threshold voltage of the FET N3 before the FET N3 is gated on. In the meantime, however, the FET P2 will be gated on, due to the high voltage difference between node 11 and 12, and being a high gain, low threshold p-channel FET, the FET P2 tends to keep the voltage at node 11 down and thereby suppress the FET N3 from being gated on as quickly as the signal level changes at the node 11.

On the other hand, when there is a minimum p-channel gain, and a maximum n-channel gain, the voltage difference between nodes 11 and 12 will be kept small due to the lower n-channel threshold, which together with a higher p-channel threshold, tends to inhibit the FET P2 from being gated on, thereby cutting off the path for the node 11 to discharge and effectively helping the node 11 to attain a higher voltage sooner.

In essence, the FET P2 and the FET N1 form parallel pull down paths for node 11 versus a single pull up path provided by the FET P1. When the gain of the p-channel FET's is greater than the gain of the n-channel FET's, the compensating loop of the FET's N3 and P2 gates on the FET P2 to help the FET N1 counteract the pull-up effect of the FET P1, and when the gain of the n-channel FET's is greater than the gain of the p-channel FET's, the compensating loop of the FET's N3 and P2 keeps the FET P2 from being gated on so that the FET P1 has to counteract the pull-down effect of only the FET N1.

The FET P4 performs two functions. First, it serves as a pull-up transistor for the node 12 so that it will not stay at one n-channel threshold below Vcc, after the FET N3 is turned off. As soon as the voltage at node 12 reaches the trip point of the second CMOS inverter P3, N4, the voltage level at the node 13 changes to turn on P4, and the node 12 is charged all the way up to the supply voltage level Vcc. Second, the FET P4 produces a 100mV hysteresis in the input buffer circuit, which can be used to advantage in a noisy environment.

The circuit of FIG. 4 also will provide compensation for the effects of the threshold of the n-channel FET's being greater than the threshold of the p-channel FET's even if the FET N1 is removed from the circuit. The theory of operation of such a modified circuit would be essentially the same as discussed above for the circuit of FIG. 4.

Figure 5:
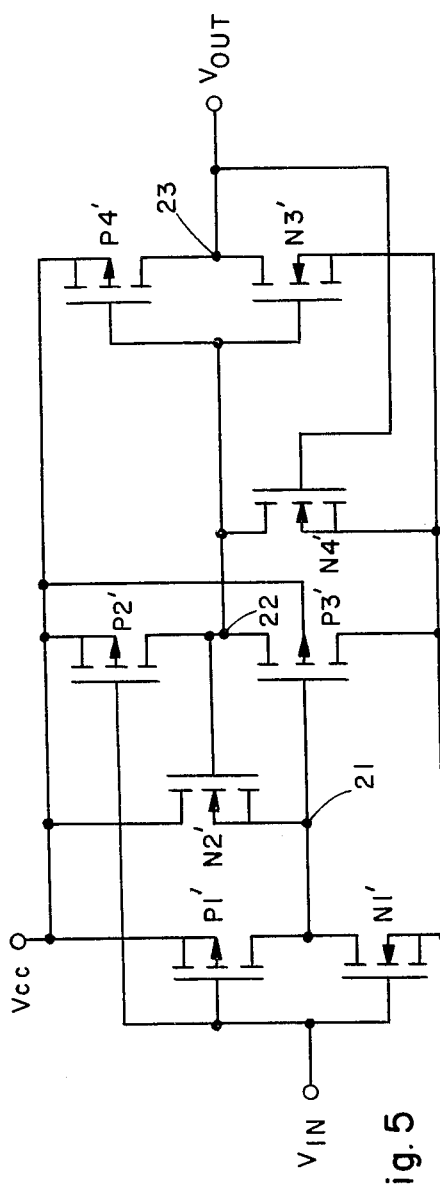
FIG. 5 is a schematic circuit diagram of another preferred embodiment of a TTL to CMOS input buffer integrated circuit according to the present invention.

FIG. 5 illustrates a TTL to CMOS input buffer integrated circuit for compensating for the effects of the threshold of the p-channel FET's being greater than the threshold of the n-channel FET's. The circuit includes an input terminal $V_{IN}$ for connection to an output terminal of a TTL device; a supply terminal Vcc; a ground terminal; first, second, third and fourth p-channel FET's P1, P2', P3' and P4'; and first, second, third and fourth n-channel FET's N1', N2', N3' and N4. The FET's N1 and P1 form a first inverter which is connected to the input terminal $V_{IN}$. The first p-channel FET P1' is connected to the supply terminal Vcc, and the first n-channel FET N1' is connected to the ground terminal. The drain of the FET P1' is connected to the drain of the FET N1' at a first node 21.

The second p-channel FET P2' has its gate connected to the input terminal $V_{IN}$, and its source connected to the supply terminal Vcc.

The third p-channel FET P3' has its gate connected to the first node 21, its drain connected to the ground terminal, its substrate connected to the supply terminal Vcc, and its source connected to the drain of the second p-channel FET P2' at a second node 22 for forcing the potential at the second node 22 to be greater than the potential at the first node 21 by the amount of the threshold voltage of the third p-channel FET P3'.

The second n-channel FET N2' has its gate connected to the second node 22, its source connected to the first node 21, and its drain connected to the supply terminal Vcc, for reducing the rate at which the third p-channel FET P3' becomes conductive when gated on in a said integrated circuit in which the threshold of the p-channel FET's is greater than the threshold of the n-channel FET's.

A second CMOS inverter formed by the FET's N3' and P4' is connected to the second node 22. The fourth p-channel FET P4' has its source connected to the supply terminal Vcc; and the third n-channel FET N3' has its source connected to the ground terminal and its drain connected to the drain of the fourth p-channel FET P4' at a third node 23 for providing a non-inverted output signal at the output terminal $V_{OUT}$.

The fourth n-channel FET N4' has its gate connected to the third node 23, its source connected to the ground terminal and its drain connected to the second node 22 for causing the potential at the second node 22 to drop low enough to terminate conduction in the third n-channel FET N3' when the fourth p-channel FET P4' has been rendered conductive, and for terminating any conduction through the third p-channel FET P3'.

FET's P3' and N2' form a compensating loop which operates in a manner that is complementary to the operation of the compensating loop formed by FET's N3 and P2 in the circuit of FIG. 4.

The circuit of FIG. 4 is preferred over the circuit of FIG. 5 because the substrate of the p-channel FET P3' cannot be connected to the source of the FET P3' in the circuit of FIG. 5, whereas in the circuit of FIG. 4, the substrate of the n-channel FET N3 can be connected to the source of the FET N3. As a result the threshold of the FET P3' is higher than it would be if its substrate could be connected to its source, and the FET's P2' and P3' cannot track as uniformly as the FET's N2 and N3.

The circuit of FIG. 5 also will provide compensation for the effects of the threshold of the p-channel FET's being greater than the threshold of the n-channel FET's even if the FET P1 is removed from the circuit.

Figure 6:
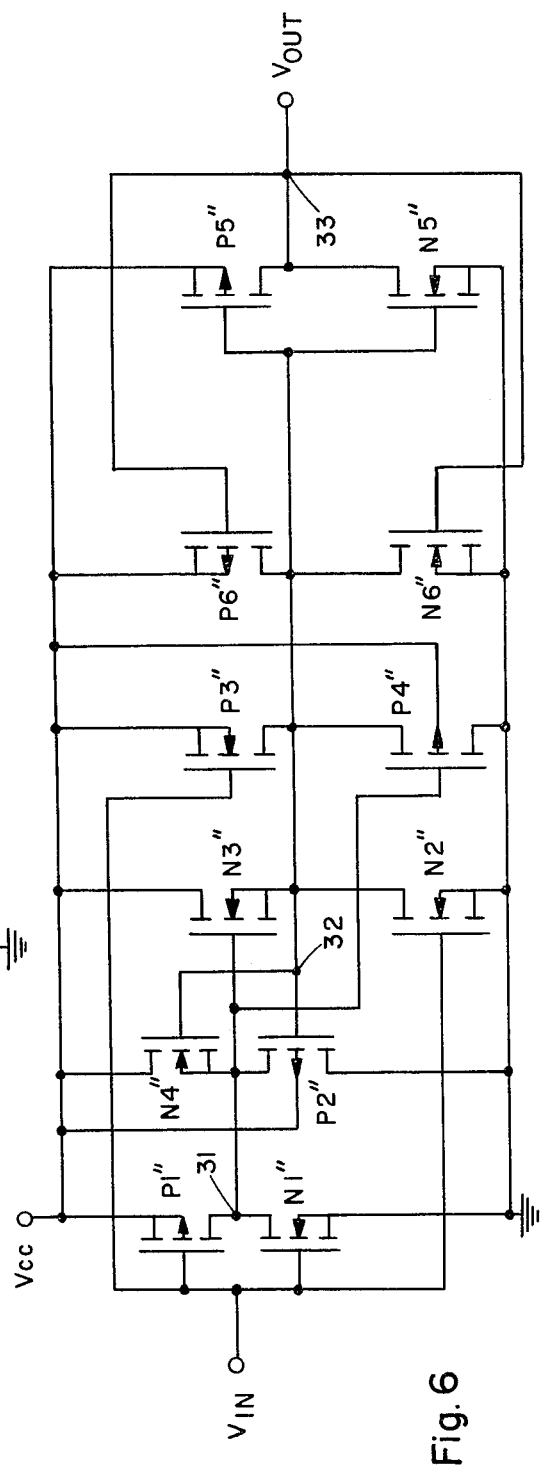
FIG. 6 is a schematic circuit diagram of still another preferred embodiment of a TTL to CMOS input buffer integrated circuit wherein the compensation features of the circuits of FIGS. 4 and 5 are combined.

The compensation features of the circuits of FIGS. 4 and 5 are combined in the TTL to CMOS input buffer integrated circuit of FIG. 6. The circuit includes an input terminal $V_{IN}$ for connection to an output terminal of a TTL device; a supply terminal Vcc; a ground terminal; first, second, third, fourth, fifth and sixth p-channel FET's P1'', P2'', P3'', P4'', P5'', and P6'', and first, second, third, fourth, fifth, and sixth n-channel FET's N1'', N2'', N3'', N4'', N5'' and N6''. The FET's P1'' and N1'' form a first CMOS inverter which is connected to the input terminal $V_{IN}$. The first p-channel FET P1'' is connected to the supply terminal Vcc, and a first n-channel FET N1'' is connected to the ground terminal. The drain of the FET P1'' is connected to the drain of the FET N1'' at a first node 31.

The second n-channel FET N2'' has its gate connected to the input terminal $V_{IN}$ and its source connected to the ground terminal.

The third n-channel FET N3'' has its gate connected to the first node 31, its drain connected to the supply terminal, and its source connected to the drain of the second n-channel FET N2'' at a second node 32 for forcing the potential at the second node 32 to be less than the potential at the first node by the amount of the threshold voltage of the third n-channel FET N3''.

The second p-channel FET P2'' has its gate connected to the second node 32, its source connected to the first node 31, its drain connected to the ground terminal, and its substrate connected to the supply terminal Vcc for reducing the rate at which the third n-channel FET N3'' becomes conductive when gated on in a said integrated circuit in which the threshold of the n-channel FET's is greater than the threshold of the p-channel FET's.

The third p-channel FET P3'' has its gate connected to the input terminal $V_{IN}$, and its source connected to the supply terminal.

The fourth p-channel FET P4'' has its gate connected to the first node 31, its drain connected to the ground terminal, its substrate connected to the supply terminal Vcc, and its source connected to the drain of the third p-channel FET P3'' at the second node 32 for forcing the potential at the second node 32 to be greater than the potential at the first node 31 by the amount of the threshold voltage of the fourth p-channel FET P4''.

The fourth n-channel FET N4'' has its gate connected to the second node 32, its source connected to the first node 31, and its drain connected to the supply terminal Vcc, for reducing the rate at which the fourth p-channel FET P4'' becomes conductive when gated on in a said integrated circuit in which the threshold of the p-channel FET's is greater than the threshold of the n-channel FET's.

A second CMOS inverter formed by the FET's N5'' and P5'' is connected to the second node 32. The fifth p-channel FET P5'' has its source connected to the supply terminal Vcc, and the fifth n-channel FET N5'' has its source connected to the ground terminal and its drain connected to the drain of the fifth p-channel FET P5'' at a third node 33 for providing a non-inverted output signal at the output terminal $V_{OUT}$.

The sixth p-channel FET P6'' has its gate connected to the third node 33, its source connected to the supply terminal and its drain connected to the second node 32 for causing the potential at the second node 32 to rise high enough to terminate conduction in the fifth p-channel FET P5'' when the fifth n-channel FET N5 has been rendered conductive, and for terminating any condition through the third n-channel FET N3''.

The sixth n-channel FET N6'' has its gate connected to the third node 33, its source connected to the ground terminal and its drain connected to the second node 32 for causing the potential at the second node 32 to drop low enough to terminate conduction in the fifth n-channel FET N5: when the fifth p-channel FET P5'' has been rendered conductive, and for terminating any conduction through the fourth p-channel FET P4''.

I claim:

1. A TTL to CMOS input buffer integrated circuit, comprising
   an input terminal for connection to an output terminal of a TTL device;
   a supply terminal;
   a ground terminal;
   a first CMOS inverter connected to the input terminal, including a first p-channel FET connected to the supply terminal and a first n-channel FET connected to the ground terminal, wherein the drain of the first p-channel FET is connected to the drain of the first n-channel FET at a first node;
   a second n-channel FET having its gate connected to the input terminal and its source connected to the ground terminal;
   a third n-channel FET having its gate connected to the first node, its drain connected to the supply terminal, and its source connected to the drain of the second n-channel FET at a second node for forcing the potential at the second node to be less than the potential at the first node by the amount of the threshold voltage of the third n-channel FET; and
   a second p-channel FET having its gate connected to the second node, its source connected to the first node, its drain connected to the ground terminal, and its substrate connected to the supply terminal for reducing the rate at which the third n-channel FET becomes conductive when gated on in a said integrated circuit in which the threshold of the n-channel FET's is greater than the threshold of the p-channel FET's.

2. A circuit according to claim 1, further comprising
   a second CMOS inverter connected to the second node, including a third p-channel FET having its source connected to the supply terminal, and a fourth n-channel FET having its source connected to the ground terminal and its drain connected to the drain of the third p-channel FET at a third node for providing a non-inverted output signal.

3. A circuit according to claim 2, further comprising
   a fourth p-channel FET having its gate connected to the third node, its source connected to the supply terminal and its drain connected to the second node for causing the potential at the second node to rise enough to terminate conduction in the third p-channel FET when the fourth n-channel FET has been rendered conductive, and for terminating any conduction through the third n-channel FET.

4. A TTL to CMOS input buffer integrated circuit, comprising
   an input terminal for connection to an output terminal of a TTL device;
   a supply terminal;
   a ground terminal;
   a first p-channel FET having its gate connected to the input terminal and its source connected to the supply terminal, wherein the drain of the first p-channel FET defines a first node;
   a first n-channel FET having its gate connected to the input terminal and its source connected to the ground terminal;
   a second n-channel FET having its gate connected to the first node, its drain connected to the supply terminal, and its source connected to the drain of the first n-channel FET at a second node for forcing the potential at the second node to be less than the potential at the first node by the amount of the threshold voltage of the second n-channel FET; and
   a second p-channel FET having its gate connected to the second node, its source connected to the first node, its drain connected to the ground terminal, and its substrate connected to the supply terminal for reducing the rate at which the second n-channel FET becomes conductive when gated on in a said integrated circuit in which the threshold of the n-channel FET's is greater than the threshold of the p-channel FET's.

5. A circuit according to claim 4, further comprising
   a CMOS inverter connected to the second node, including a third p-channel FET having its source connected to the supply terminal, and a third n-channel FET having its source connected to the ground terminal and its drain connected to the drain of the third p-channel FET at a third node for providing a non-inverted output signal.

6. A circuit according to claim 5, further comprising
   a fourth p-channel FET having its gate connected to the third node, its source connected to the supply terminal and its drain connected to the second node for causing the potential at the second node to rise high enough to terminate conduction in the third p-channel FET when the third n-channel FET has been rendered conductive, and for terminating any conduction through the second n-channel FET.

7. A TTL to CMOS input buffer integrated circuit, comprising
   an input terminal for connection to an output terminal of a TTL device;
   a supply terminal;
   a ground terminal;
   a first CMOS inverter connected to the input terminal, including a first p-channel FET connected to the supply terminal and a first n-channel FET connected to the ground terminal, wherein the drain of the first p-channel FET is connected to the drain of the first n-channel at a first node;
   a second p-channel FET having its gate connected to the input terminal, and its source connected to the supply terminal;
   a third p-channel FET having its gate connected to the first node, its drain connected to the ground terminal, its substrate connected to the supply terminal, and its source connected to the drain of the second p-channel FET at a second node for forcing the potential at the second node to be greater than the potential at the first node by the amount of the threshold voltage of the third p-channel FET; and
   a second n-channel FET having its gate connected to the second node, its source connected to the first node, and its drain connected to the supply terminal, for reducing the rate at which the third p-channel FET becomes conductive when gated on in a said integrated circuit in which the threshold of the p-channel FET's is greater than the threshold of the n-channel FET's.

8. A circuit according to claim 7, further comprising
   a second CMOS inverter connected to the second node, including a fourth p-channel FET having its source connected to the supply terminal, and a third n-channel FET having its source connected to the ground terminal and its drain connected to the drain of the fourth p-channel FET at a third node for providing a non-inverted output signal.

9. A circuit according to claim 6, further comprising a fourth n-channel FET having its gate connected to the third node, its source connected to the ground terminal and its drain connected to the second node for causing the potential at the second node to drop low enough to terminate conduction in the third n-channel FET when the fourth p-channel FET has been rendered conductive, and for terminating any conduction through the third p-channel FET.

10. A TTL to CMOS input buffer integrated circuit, comprising
an input terminal for connection to an output terminal of a TTL device;
a supply terminal;
a ground terminal;
a first n-channel FET having its gate connected to the input terminal, and its source connected to the ground terminal, wherein the drain of the first n-channel FET defines a first node;
a first p-channel FET having its gate connected to the input terminal and its source connected to the supply terminal;
a second p-channel FET having its gate connected to the first node, its drain connected to the ground terminal, its substrate connected to the supply terminal, and its source connected to the drain of the first p-channel FET at a second node for forcing the potential at the second node to be greater than the potential at the first node by the amount of the threshold voltage of the second p-channel FET; and
a second n-channel FET having its gate connected to the second node, its source connected to the first node, and its drain connected to the supply terminal, for reducing the rate at which the second p-channel FET becomes conductive when gated on in a said integrated circuit in which the threshold of the p-channel FET's is greater than the threshold of the n-channel FET's.

11. A circuit according to claim 10, further comprising
a CMOS inverter connected to the second node, including a third p-channel FET having its source connected to the supply terminal, and a third n-channel FET having its source connected to the ground terminal and its drain connected to the drain of the third p-channel FET at a third node for providing a non-inverted output signal.

12. A circuit according to claim 11, further comprising
a fourth n-channel FET having its gate connected to the third node, its source connected to the ground terminal and its drain connected to the second node for causing the potential at the second node to drop low enough to terminate conduction in the third n-channel FET when the third p-channel FET has been rendered conductive, and for terminating any conduction through the second p-channel FET.

* * * * *